(12) United States Patent
Yamada et al.

(10) Patent No.: US 8,940,266 B2
(45) Date of Patent: Jan. 27, 2015

(54) LARGE DIAMOND CRYSTAL SUBSTRATES AND METHODS FOR PRODUCING THE SAME

(75) Inventors: Hideaki Yamada, Ikeda (JP); Akiyoshi Chayahara, Ikeda (JP); Yoshiaki Mokuno, Ikeda (JP); Shinichi Shikata, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 461 days.

(21) Appl. No.: 12/646,163

(22) Filed: Dec. 23, 2009

(65) Prior Publication Data
US 2010/0166636 A1   Jul. 1, 2010

(30) Foreign Application Priority Data
Dec. 25, 2008   (JP) ................. 2008-328987

(51) Int. Cl.
| | | |
|---|---|---|
| B01J 3/06 | (2006.01) | |
| C30B 33/06 | (2006.01) | |
| C30B 23/00 | (2006.01) | |
| B01J 19/08 | (2006.01) | |
| C23C 14/00 | (2006.01) | |
| C30B 29/04 | (2006.01) | |
| C30B 33/00 | (2006.01) | |
| C01B 31/06 | (2006.01) | |
| C30B 25/00 | (2006.01) | |

(52) U.S. Cl.
CPC ............. *C30B 29/04* (2013.01); *C30B 33/00* (2013.01); *C30B 23/00* (2013.01); *C01B 31/06* (2013.01); *C01B 31/065* (2013.01); *C30B 25/00* (2013.01); *C30B 33/06* (2013.01)

USPC ............... 423/446; 117/1; 117/90; 427/457; 427/523

(58) Field of Classification Search
None
See application file for complete search history.

(56) References Cited

U.S. PATENT DOCUMENTS

| | | |
|---|---|---|
| 5,127,983 A | 7/1992 | Imai et al. |
| 5,198,070 A | 3/1993 | Jones |

(Continued)

FOREIGN PATENT DOCUMENTS

| | | |
|---|---|---|
| EP | 0687747 A1 | 5/1995 |
| JP | 03-075298 A | 3/1991 |

(Continued)

OTHER PUBLICATIONS

Posthill et al.; Method of Fabricating a Free Standing Diamond Single Crystal Using Growth from the Vapor Phase; J. Appl. Phys.; 79(5); 1996.*

(Continued)

*Primary Examiner* — Guinever Gregorio
(74) *Attorney, Agent, or Firm* — Westerman, Hattori, Daniels & Adrian, LLP

(57) ABSTRACT

The present invention provides a method for producing a large substrate of single-crystal diamond, including the steps of preparing a plurality of single-crystal diamond layers separated form an identical parent substrate, placing the single-crystal diamond layers in a mosaic pattern on a flat support, and growing a single-crystal diamond by a vapor-phase synthesis method on faces of the single-crystal diamond layers where they have been separated from the parent substrate. According to the method of the invention, a mosaic single-crystal diamond having a large area and good quality can be produced relatively easily.

12 Claims, 2 Drawing Sheets

(56) References Cited

U.S. PATENT DOCUMENTS

| | | | |
|---|---|---|---|
| 5,474,021 A * | 12/1995 | Tsuno et al. | 117/97 |
| 2006/0216220 A1 | 9/2006 | Meguro et al. | |
| 2007/0017437 A1 | 1/2007 | Genis et al. | |
| 2007/0175384 A1 * | 8/2007 | Bruderl et al. | 117/89 |
| 2008/0134959 A1 * | 6/2008 | Kasu et al. | 117/84 |
| 2008/0156256 A1 * | 7/2008 | Linares et al. | 117/101 |
| 2008/0170981 A1 * | 7/2008 | Genis et al. | 423/446 |
| 2009/0291287 A1 * | 11/2009 | Twitchen et al. | 428/220 |
| 2009/0308305 A1 * | 12/2009 | Mokuno et al. | 117/108 |
| 2010/0015438 A1 * | 1/2010 | Williams et al. | 428/332 |
| 2010/0178234 A1 * | 7/2010 | Noguchi | 423/446 |
| 2011/0151226 A1 * | 6/2011 | Twitchen et al. | 428/220 |

FOREIGN PATENT DOCUMENTS

| | | |
|---|---|---|
| JP | 6-53638 B2 | 7/1994 |
| JP | 7-048198 A | 2/1995 |
| JP | 2006-306701 A | 11/2006 |
| WO | 2008/013108 A1 | 1/2008 |

OTHER PUBLICATIONS

Hunn et al.; The Separation of Thin Single Crystal Films From Bulk Diamond by MeV Implantation; Nuclear Instruments and Methods in Physics Research B; 99, 602-605; 1999.*

Japanese Office Action dated Jan. 25, 2011, issued in corresponding Japanese Patent Application No. 2008-328987.

Arima, K et al, "Effects of Vicinal Angles from (001) Surface on the Boron-Doping Features of High-Quality Homoepitaxial Diamond Films Grown by the High-Power Microwave Plasma Chemical-Vapor-Deposition Method", Journal of Crystal Growth 309, 2007, pp. 145-152.

Maida, O et al, "Characterization of Substrate Off-Angle Effects for High-Quality Homoepitaxial CVD Diamond Films", Diamond and Related Materials 17, 2008, pp. 435-439.

Meguro, K et al, "Development of Large Single Crystal Diamond Growth Process", SEI Technical Review 163, 2003, pp. 53-59.

Okushi, H et al, "High Quality Homoepitaxial CVD Diamond for Electronic Devices", Diamond and Related Materials 10, 2001, pp. 281-288.

Weiser, P S et al, "Homo-Epitaxial Diamond Film Growth on Ion Implanted Diamond Substrates", Diamond and Related Materials 5, 1996, pp. 272-275.

Japanese Office Action dated Jul. 19, 2011, issued in corresponding Japanese Patent Application No. 2008-328987.

* cited by examiner

LARGE DIAMOND CRYSTAL SUBSTRATES AND METHODS FOR PRODUCING THE SAME

BACKGROUND OF THE INVENTION (1) Field of the Invention

The present invention relates to single-crystal diamond substrates having a large area, and methods for producing such substrates.

(2) Description of the Related Art

Diamond, which exhibits outstanding properties as a semiconductor, is a promising material for use in semiconductor devices, such as high-output power devices, high-frequency devices, light-receiving devices, etc. In particular, in order to realize the practical use of diamond as a semiconductor material, wafers of single-crystal diamond having a large area and uniform quality are required.

Typical methods for growing single-crystal diamond heretofore used include a high-pressure synthesis method and a vapor-phase synthesis method. Of these methods, the high-pressure synthesis method can produce substrates with an area of only up to about 1×1 cm, and cannot be expected to produce single-crystal substrates with a larger area. Furthermore, single-crystal diamond substrates with an area of about 5×5 mm or more are not readily available, nor is it easy to increase the substrate area of these substrates.

For this reason, a method for producing a so-called mosaic diamond has been developed to prepare a single-crystal diamond with a large area. This method involves growing diamond crystals by a vapor-phase method on a plurality of diamond crystals aligned on a support surface, and bonding the aligned diamond crystals, thereby producing a large diamond crystal (see Meguro, Nishibayashi, and Imai, *SEI Technical Review* 163, 53 (2003)).

In the known production method of a mosaic diamond, only single-crystal diamond substrates are used, or single-crystal diamond substrates are used together with polycrystal diamonds or other material(s), as the substrates to be bonded. In either case, these diamond substrates are bonded by growing a diamond thereon by a vapor-phase method.

Among these methods, as one example of a method for producing a large single-crystal diamond by using only single-crystal diamond substrates, and bonding these substrates, a method for producing a large diamond crystal has been reported, in which the spacing and differences in height among the single-crystal diamond substrates to be bonded are adjusted to be within predetermined ranges, and a diamond crystal layer is grown on these substrates by a vapor-phase method, thereby suppressing the growth of non-epitaxial crystallites along the boundary between substrates (see Japanese Unexamined Patent Publication No. 7-48198).

Another method has been proposed in which diamond substrates having suitable off-angles and off-directions are selected and aligned; subsequently, diamond crystals are grown by a vapor-phase synthesis method preferentially in the direction of adjacent single crystals to promote bonding (see Japanese Unexamined Patent Publication No. 2006-306701).

Also known are a method in which cleaved faces are used as the side faces to be bonded, and a method in which the side faces to be bonded are angled (see Japanese Examined Patent Publication No. 6-53638 and EP 0687747 A1).

It is noted that methods for growing single-crystal diamond on diamond substrates by homoepitaxial growth using a vapor-phase synthesis method are applied to, for example, the synthesis of semiconductor-grade, high-quality diamond. However, during epitaxial growth of diamond by a vapor-phase synthesis method, many defects such as non-epitaxial crystallites and hillocks tend to occur, making the synthesis of a large single-crystal diamond difficult.

The formation of these defects strongly depends on the off-angle and off-direction of the substrate surface on which a diamond is grown. It has been reported that even a change of 1° in the off-angle and off-direction of this substrate surface will alter the properties of the growth layer (see, e.g., H. Okushi, *Diamond and Related Materials* 10 (2001), 281-288; and O. Maida, H. Miyatake, T. Teraji, and T. Ito, *Diamond and Related Materials* 17 (2008), 435-439.). The off-angle and off-direction dependencies also vary according to the synthesis conditions. Thus, the properties of the growth layers do not become uniform, unless the synthesis conditions are adjusted according to the off-angle and off-direction of each substrate during the growth of single-crystal diamond on substrates having different off-angles and off-directions.

Defects on the substrate surface are also continued in the growth layer, and the positions of these defects cannot be controlled for each substrate. Therefore, the presence of these defects is one hindrance to achieving uniform growth layer properties. Furthermore, it is known that the properties of a growth layer are also affected by strains present in the substrate prior to growth (see P. S. Weiser and S. Prawer, K. W. Nugent, A. A. Bettiol, L. I. Kostidis, D. N. Jamieson, *Diamond and Related Materials* 5 (1996), 272-275.).

Generally, in methods for preparing mosaic diamonds by growing diamond crystals on a plurality of diamond crystals by a vapor-phase method, the threshold at which the off-angles of diamond substrates to be bonded are considered to be identical is 1° or more at a minimum. However, even a difference of 1° in off-angle will result in variations in the qualities of growth layers under identical conditions. On the mosaic substrate bonded by this method, a single-crystal layer having a different quality according to each crystal region of the bonded single crystals will grow. Similar problems also arise in the method described above, wherein substrates with different off-angles and off-directions are positively used and bonded with one another to produce a mosaic substrate (see Japanese Unexamined Patent Publication No. 2006-306701).

As stated previously, in homoepitaxial growth on diamond substrates using a vapor-phase synthesis method, the growth layer is affected not only by the off-angle, but also by the off-direction and substrate properties such as strains and defects in the substrate. Nevertheless, none of the previously known methods for producing mosaic substrates have proposed an effective solution to make the properties of substrates to be bonded uniform.

Furthermore, when diamond is used as a material for semiconductor devices, impurities are intentionally doped into the growth diamond on substrates (diamond wafers). It is known that the amount of the impurities doped into the growth layer, as well as the resulting change in crystallinity, will depend on the substrate properties (see K. Arima, H. Miyatake, T. Teraji, and T. Ito, *Journal of Crystal Growth* 309 (2007), 145-152.). Therefore, if large diamond wafers obtained using any of the above-mentioned methods do not have a uniform off-angle, off-direction, strain distribution, defect distribution, etc., it is expected that the devices prepared thereon will also exhibit non-uniform properties. Therefore, the use of these mosaic wafers with non-uniform properties will obviously result in an extremely low yield of devices that can withstand practical use. Further, because mosaic diamond substrates must be strong enough to withstand processing for device preparation, it is sometimes necessary to additionally grow a single-crystal diamond onto the bonded substrates. If the single-crystal diamonds used as the substrates to be bonded have different properties, it will be difficult to uniformly grow the single-crystal diamond on the bonded substrates.

Furthermore, as mentioned above, it is difficult to obtain a desired number of crystals whose substrate properties are uniform. For example, the preparation of diamond substrates that meet predetermined requirements by processing a single-crystal diamond requires a great deal of time, because processing of the diamond crystal is very difficult; moreover, the preparation of a precisely processed single-crystal diamond substrate is difficult. In particular, it is impossible to impart specific strain and defect distributions to a given substrate.

For reasons as stated above, despite their high demand, single-crystal diamond substrates with a large area that can withstand practical use are not available yet.

SUMMARY OF THE INVENTION

The present invention has been accomplished in view of the above-mentioned state of the prior art. A principal object of the invention is to provide methods for producing single-crystal diamond substrates with a large area by bonding a plurality of single-crystal diamond substrates having uniform properties, which enable large mosaic single-crystal diamonds of good quality to be produced relatively easily.

The inventors conducted extensive research to achieve the above-mentioned object, and consequently arrived at the following finding.

First, a single-crystal diamond is used as a parent substrate, and a non-diamond layer is formed near the surface of the diamond by ion implantation, allowing a surface portion to be easily separated from the non-diamond layer (the separated diamond layer is hereinafter sometimes referred to as the "child substrate" or "child substrate layer"). By using in this step the ion implantation and etching method described below, the off-angle and crystal direction of the parent substrate can be maintained in the child substrate. Thus, the face of the child substrate layer where it is separated from the parent substrate has a crystal off-angle and crystal direction identical to those of the parent substrate, and has strain and defect distributions identical to those of the parent substrate. By separating a plurality of diamond layers from the identical parent substrate by repeating this procedure, it is possible to easily prepare a plurality of child substrates having a uniform off-angle, crystal plane direction, strain distribution, defect distribution, etc.

When the thus-obtained single-crystal diamonds (child substrates) have a substantially identical thickness, they may be arranged in a mosaic pattern on a flat support such that their faces separated from the parent substrate face up. In this case, all of the single-crystal diamonds constituting a mosaic maintain, on the top faces thereof, the off-angle, crystal direction, strain and defect distributions, etc. of the parent substrate. Therefore, by growing a single-crystal diamond on the top faces by a vapor-phase synthesis method, the boundary between adjacent single-crystal diamonds is uniformly coated with the grown diamond, allowing a large single-crystal diamond having a uniform off-angle, crystal plane direction, strain distribution, defect distribution, etc. to be easily produced.

When the diamond substrates separated from the parent substrate do not have an identical thickness, they are aligned on a flat support such that the faces separated from the parent substrate are in contact with the surface of the support, and a diamond is subsequently grown thereon by a vapor-phase synthesis method. In this way, the single-crystal diamond substrates aligned on the support are bonded with the grown diamond layers. The bonded diamonds are subsequently inverted on the support, with the faces separated from the parent substrate facing up. Each single-crystal diamond maintains, on this face, the off-angle, crystal direction, strain and defect distributions, etc. of the parent substrate. That is, all of the single-crystal diamonds constituting a mosaic have an identical off-angle, crystal plane direction, strain distribution, defect distribution, etc. By subsequently growing a single-crystal diamond on these faces by a vapor-phase synthesis method, the boundary between adjacent single-crystal diamonds is uniformly coated with the grown diamond, allowing the formation of a large single-crystal diamond having a uniform off-angle, crystal plane direction, strain distribution, defect distribution, etc.

Furthermore, large single-crystal diamonds produced by this method can be used instead of child substrates separated from the identical parent substrate, and can be similarly bonded with one another, thereby preparing an even larger single-crystal diamond.

The above-described method can eliminate troublesome processing for making the thickness, off-angle, crystal plane direction, strain and defect distributions, etc. of the single-crystal diamonds to be bonded uniform. The faces on which a diamond is grown have a uniform off-angle, crystal plane direction, strain distribution, defect distribution, etc., thereby enabling precise growth of diamond. Furthermore, because the thus-prepared large substrate has a uniform off-angle, crystal plane direction, strain distribution, defect distribution, etc., it is not necessary to consider the distribution of these properties when making devices on this substrate, thereby allowing devices with uniform properties to be easily prepared. Additionally, because the thus-prepared large substrate contains uniform defects, any unwanted portion can be easily identified. Furthermore, because the large substrate has the uniform properties across the entire region of the substrate surface, a diamond can be further grown on the substrate easily.

The present invention has been accomplished as a result of further research based on the above-described findings.

In summary, the invention provides large single-crystal diamond substrates and methods for producing the substrates, as set forth below.

1. A method for producing a single-crystal diamond substrate having a large area, comprising the steps of:

(1) implanting ions into a parent substrate of single-crystal diamond to form a graphitized, non-diamond layer near a surface of the parent substrate, and subsequently etching the non-diamond layer to separate therefrom a single-crystal diamond layer above the non-diamond layer;

(2) repeatedly subjecting the parent substrate used in Step (1) to the operation of Step (1), to separate from the parent substrate one or more single-crystal diamond layers having a substantially identical thickness to that of the single-crystal diamond layer separated in Step (1);

(3) placing the plurality of single-crystal diamond layers separated in Steps (1) and (2) on a flat support such that side faces of adjacent diamond layers are in contact with each other, and faces of the diamond layers where the diamond layers have been separated from the parent substrate are exposed as top faces; and (4) growing a single-crystal diamond by a vapor-phase synthesis method on the faces of the plurality of single-crystal diamond layers placed on the support in Step (3), thereby bonding the plurality of single-crystal diamond layers.

2. The method according to Item 1, wherein Step (1) further comprises, subsequent to forming a non-diamond layer, and prior to etching the non-diamond layer, growing a single-crystal diamond layer on the surface of the parent substrate by a vapor-phase synthesis method.

3. A method for producing a single-crystal diamond substrate having a large area, comprising the steps of:
(1) implanting ions into a parent substrate of single-crystal diamond to form a graphitized, non-diamond layer near a surface of the parent substrate, and subsequently etching the non-diamond layer to separate therefrom a single-crystal diamond layer above the non-diamond layer;
(2) repeatedly subjecting the parent substrate used in Step (1) to the operation of Step (1), to further separate from the parent substrate one or more single-crystal diamond layers;
(3) placing the plurality of single-crystal diamond layers separated in Steps (1) and (2) on a flat support such that side faces of adjacent diamond layers are in contact with each other, and faces of the diamond layers where the diamond layers have been separated from the parent substrate are in contact with a surface of the support;
(4) growing a single-crystal diamond by a vapor-phase synthesis method on the plurality of single-crystal diamond layers placed on the support in Step (3), thereby bonding the plurality of single-crystal diamond layers; and
(5) inverting the single-crystal diamond layers bonded in Step (4) on the support, and subsequently growing a single-crystal diamond on the diamond layers by a vapor-phase synthesis method, thereby growing a single-crystal diamond on faces of the diamond layers where the diamond layers have been separated from the parent substrate.

4. The method according to Item 3, wherein Step (1) further comprises, subsequent to forming a non-diamond layer, and prior to etching the non-diamond layer, growing a single-crystal diamond layer on the surface of the parent substrate by a vapor-phase synthesis method.

5. The method according to Item 1, wherein the single-crystal diamond substrate having a large area obtained by the method of Item 1 is used as the parent substrate.

6. The method according to Item 1, wherein the single-crystal diamond substrate having a large area obtained by the method of Item 3 is used as the parent substrate.

7. The method according to Item 3, wherein the single-crystal diamond substrate having a large area obtained by the method of Item 1 is used as the parent substrate.

8. The method according to Item 3, wherein the single-crystal diamond substrate having a large area obtained by the method of Item 3 is used as the parent substrate.

9. A method for producing a single-crystal diamond substrate having a large area, comprising the steps of:
preparing a plurality of large single-crystal diamond substrates having a substantially identical thickness according to the method of Item 1;
placing the large substrates on a flat support such that side faces of adjacent substrates are in contact with each other, and single-crystal diamond layers grown by a vapor-phase synthesis method in Step (4) of Item 1 are exposed as top faces; and
growing a single-crystal diamond thereon by a vapor-phase synthesis method, thereby bonding the plurality of large substrates.

10. A method for producing a single-crystal diamond substrate having a large area, comprising the steps of:
preparing a plurality of large single-crystal diamond substrates having a substantially identical thickness according to the method of Item 2;
placing the large substrates on a flat support such that side faces of adjacent substrates are in contact with each other, and single-crystal diamond layers grown by a vapor-phase synthesis method in Step (4) of Item 1 are exposed as top faces; and
growing a single-crystal diamond thereon by a vapor-phase synthesis method, thereby bonding the plurality of large substrates.

11. A method for producing a single-crystal diamond substrate having a large area, comprising the steps of:
preparing a plurality of large single-crystal diamond substrates having a substantially identical thickness according to the method of Item 3;
placing the large substrates on a flat support such that side faces of adjacent substrates are in contact with each other, and single-crystal diamond layers grown by a vapor-phase synthesis method in Step (5) of Item 3 are exposed as top faces; and
growing a single-crystal diamond thereon by a vapor-phase synthesis method, thereby bonding the plurality of large substrates.

12. A method for producing a single-crystal diamond substrate having a large area, comprising the steps of:
preparing a plurality of large single-crystal diamond substrates having a substantially identical thickness according to the method of Item 4;
placing the large substrates on a flat support such that side faces of adjacent substrates are in contact with each other, and single-crystal diamond layers grown by a vapor-phase synthesis method in Step (5) of Item 3 are exposed as top faces; and
growing a single-crystal diamond thereon by a vapor-phase synthesis method, thereby bonding the plurality of large substrates.

13. A single-crystal diamond substrate having a large area which is prepared by the method of Item 1.

14. A single-crystal diamond substrate having a large area which is prepared by the method of Item 2.

15. A single-crystal diamond substrate having a large area which is prepared by the method of Item 3.

16. A single-crystal diamond substrate having a large area which is prepared by the method of Item 4.

17. A single-crystal diamond substrate having a large area which is prepared by the method of Item 9.

18. A single-crystal diamond substrate having a large area which is prepared by the method of Item 10.

19. A single-crystal diamond substrate having a large area which is prepared by the method of Item 11.

20. A single-crystal diamond substrate having a large area which is prepared by the method of Item 12.

The methods for producing a single-crystal diamond substrate having a large area of the invention will be described in detail below.

Parent Substrate

In the invention, a single-crystal diamond substrate is used as the parent substrate. The type of the single-crystal diamond is not limited; for example, a single-crystal diamond whose surface has a crystal face capable of epitaxial growth, or a single-crystal diamond having an angle of inclination, i.e., an off-angle, with respect to the above-mentioned crystal face, can be used. The method for producing such a single-crystal diamond is also not limited. Examples of usable single-crystal diamonds include, in addition to natural diamonds, single crystal diamonds produced by a high-pressure synthesis method, single-crystal diamonds produced by vapor-phase synthesis, etc.

Typically, a single-crystal diamond having a surface along a (100), (111), or a like plane can be used, or a single-crystal diamond having an off-angle of up to about 10° with respect to any of these crystal planes, can be used, particularly for growing a semiconductor-grade diamond.

Ion Implantation Step

In the invention, ions are first implanted from one surface of the single-crystal diamond used as the parent substrate to form an ion-implanted layer whose crystal structure is deteriorated near the surface of the diamond.

The ion implantation method is a method in which a sample is irradiated with swift ions. In general, ion implantation is performed as follows: a desired element is ionized, and a voltage is applied to the resulting ions to accelerate the ions in an electric field. The ions are subsequently mass-separated, and those with a desired level of energy are directed to the sample. Alternatively, it may be performed by plasma ion implantation, wherein the sample is immersed in plasma, and negative high-voltage pulses are applied to the sample, thereby attracting positive ions in the plasma to the sample. Examples of implanted ions include carbon, oxygen, argon, helium, protons, and the like.

The ion implantation energy may be in the range of about 10 keV to about 10 MeV, which is typically used in ion implantation. Implanted ions are distributed mainly in an average depth (projectile range), with a certain width of depth; the average depth is determined according to the type and energy of the ions, as well as the type of the ion-implanted material. Damage to the sample is the greatest in the vicinity of the projectile range where ions stop, but the surface side of the substrate above the vicinity of the projectile range is also damaged to some extent by the passage of ions. The projectile range and the extent of damage can be calculated and predicted using a Monte Carlo simulation code, such as the SRIM code.

By implanting ions into the parent substrate, once the dose has exceeded a certain level, the surface side of the substrate above the vicinity of the projectile range deteriorates, causing the diamond structure to be destroyed, resulting in the formation of a non-diamond layer.

The depth and thickness of the resulting non-diamond layer vary depending on the type of ion used, the ion implantation energy, the dose, and the like. Therefore, these conditions may be determined so that a separable non-diamond layer is formed in the vicinity of the projectile range. Typically, the atomic density of a region having the highest atomic density of implanted ions is preferably about $1\times10^{20}$ atoms/cm$^3$ or more. In order to ensure that a non-diamond layer is formed, the atomic density is preferably about $1\times10^{21}$ atoms/cm$^3$ or more, i.e., a displacement damage of 1 dpa or more.

For example, when carbon ions are implanted at an implantation energy of 3 MeV, the ion dose may be about $1\times10^{16}$ ions/cm$^2$ to about $1\times10^{17}$ ions/cm$^2$. In this case, if the ion dose is too high, the crystallinity of the surface will degrade; whereas if the dose is too low, a non-diamond layer will not be sufficiently formed, making it difficult to separate the surface portion.

A non-diamond layer is formed near the surface of the parent substrate by conducting ion implantation according to the above-described method.

In the invention, the depth at which the non-diamond layer is formed is not limited; however, the greater the depth, the thicker the surface portion that can be subsequently separated.

After the ion implantation, a heat treatment is conducted at a temperature of 600° C. or higher in a non-oxidizing atmosphere such as vacuum, a reducing atmosphere, or an oxygen-free inert gas atmosphere, thereby allowing graphitization of the non-diamond layer to proceed. This causes etching in the subsequent step to proceed more rapidly. The upper limit for the heat-treatment temperature is the temperature at which the diamond begins to graphitize, which is typically about 1,200° C. The heat-treatment time varies depending on the treatment conditions such as the heat-treatment temperature and the like; for example, it may be about 5 minutes to about 10 hours.

Further, to provide the surface portion to be separated in the etching process described below with a desired thickness, a single-crystal diamond layer may be grown on the parent substrate after the ion implantation and prior to the step of etching the non-diamond layer. The growth method is not limited; known vapor-phase synthesis methods that are applicable include, for example, a microwave plasma CVD method, a hot filament method, a DC discharge method, etc. A high-purity diamond film can be grown by using, in particular, a microwave plasma CVD method. Specific production conditions are not limited; a single-crystal diamond may be grown according to known conditions. For example, a gas mixture of methane and hydrogen can be used as a source gas. The addition of nitrogen gas to this mixture can further enhance the growth rate.

Specifically, the conditions for diamond growth may, for example, be as follows. When a gas mixture of hydrogen, methane, and nitrogen is used as a reaction gas, methane is preferably supplied in a proportion of about 0.01 to about 0.33 mol per mol of hydrogen supplied, and nitrogen is preferably supplied in a proportion of about 0.0005 to about 0.1 mol per mol of methane supplied.

The pressure inside the plasma CVD apparatus can be typically about 13.3 to about 40 kPa. Microwaves typically used are those having a frequency of 2.45 GHz, 915 MHz, or like frequencies that are industrially or scientifically sanctioned. The microwave power is not limited, and is typically about 0.5 to about 5 kW. Within these ranges, the conditions may be adjusted so that the temperature of the single-crystal diamond substrate is about 900 to about 1,300° C., preferably about 1,000 to about 1,100° C., and more preferably about 1,040 to about 1,060° C.

Step of Etching the Non-Diamond Layer

After graphitization of the non-diamond layer by the method described above, and optional growth of a single-crystal diamond layer, the surface portion is separated from the non-diamond layer by etching the non-diamond layer. This causes the single-crystal diamond at the surface portion to be separated. The separated face maintains the crystal face of the parent substrate. Therefore, when the parent substrate has an off-angle, the separated face of the separated crystal (child substrate) has an off-angle and crystal direction identical to those of the parent substrate, and also maintains the strain and defect distributions of the parent substrate.

The method for separating the surface portion from the non-diamond layer is not limited; for example, methods such as electrochemical etching, thermal oxidation, electric discharge machining, etc. can be applied.

An example of the method for removing the non-diamond layer by electrochemical etching is as follows. Two electrodes are disposed in an electrolytic solution at a certain interval. A single-crystal diamond in which a non-diamond layer is formed is placed between the electrodes in the electrolytic solution, and a DC voltage is applied across the electrodes. Pure water is preferable as the electrolytic solution. While the electrode material may be any conductive material, chemically stable electrodes, such as platinum, graphite, or the like, are preferable. The electrode interval and the applied voltage may be adjusted so that the etching proceeds most rapidly. The electric field strength in the electrolytic solution is typically about 100 to about 300 V/cm.

Moreover, when etching is conducted by applying an AC voltage in the method for removing the non-diamond layer by electrochemical etching, even if a large single-crystal diamond substrate is used, etching proceeds extremely rapidly into the non-diamond layer of the crystal, allowing the diamond at the surface side above the non-diamond layer to be separated in a short period of time.

Also in the method wherein an AC voltage is applied, the electrode interval and the applied voltage may be adjusted so that the etching proceeds most rapidly. Typically, the electric field strength in the electrolytic solution, determined by dividing the applied voltage by the electrode interval, is preferably about 50 to about 10,000 V/cm, and more preferably about 500 to about 10,000 V/cm.

While a commercial sinusoidal alternating current with a frequency of 60 or 50 Hz is readily available as an alternating current, the waveform may be a waveform other than a sinusoidal wave, as long as the current has a similar frequency component.

Advantageously, pure water used as an electrolytic solution has a higher resistivity (i.e., a lower conductivity) to allow the application of a higher voltage. Ultrapure water produced using a general apparatus for producing ultrapure water has a sufficiently high resistivity, i.e., about 18 MΩ·cm, and is thus suitable for use as an electrolytic solution.

An example of the method for removing the non-diamond layer by thermal oxidation is as follows. The substrate is heated to a high temperature of about 500 to about 900° C. in an oxygen atmosphere, thereby etching the non-diamond layer by oxidation. In this method, as etching proceeds farther into the diamond, the passage of oxygen from the outer periphery of the crystal becomes difficult. For this reason, if oxygen ion has been selected as the ion to form a non-diamond layer, and implanted at a dose sufficiently greater than the dose necessary for etching to occur, oxygen can also be supplied from the inside of the non-diamond layer during etching, allowing the non-diamond layer to be etched more rapidly.

Because the graphitized non-diamond layer is conductive, it can also be cut (etched) by electric discharge machining.

Further, after the surface portion above the non-diamond layer has been separated by the method described above, the separated face may be optionally polished by scaife polishing or the like for final polishing, so as to remove the deteriorated layer formed by ion implantation. Since the amount of final polishing is typically about several micrometers or less, which is about equal to the thickness of the ion-implanted layer, the deteriorated layer can be removed within an extremely short period of time, with little deviation in the crystal plane.

Step of Preparing a Plurality of Child Substrates

The parent substrate from which the single-crystal diamond at the surface portion has been separated by the above-described method is again repeatedly subjected to the formation of a non-diamond layer by ion implantation and the separation of the surface portion above the non-diamond layer by etching, in the same manner as described above, thereby preparing a required number of child substrates.

All of the child substrates obtained by this method have an off-angle, crystal plane direction, strain distribution, and defect distribution identical to those of the parent substrate. Further, child substrates having a substantially identical thickness can be easily obtained by employing identical conditions for ion implantation.

FIG. 1 shows schematic cross sections of the child substrates separated according to the method of the invention. As shown in the upper diagram of FIG. 1, the child substrate layers grown on the parent substrate maintain the strains and defects in the crystal face of the parent substrate, and hence have an off-angle, crystal plane direction, strain distribution, and defect distribution identical to those of the parent substrate. As shown in the lower diagram of FIG. 1, when a plurality of child substrates are separated from the identical parent substrate, each child substrate has an off-angle, crystal plane direction, strain distribution, and defect distribution identical to those of the parent substrate. When these substrates are arranged in a planar array, the thus-arranged substrates have a uniform off-angle, crystal plane direction, strain distribution, defect distribution, etc.

The child substrates must be aligned such that side faces of adjacent child substrates are in contact with each other, and the directions of the crystal faces are identical. Therefore, each child substrate must have linear side faces so that it can be placed with its side face being in contact with a side face of another child substrate. When the parent substrate has a rectangular surface shape, child substrates prepared therefrom will also have a rectangular surface shape, so that one of the side faces can be utilized. In this case, when placing the child substrates, the child substrates are preferably placed in such a manner that the angle formed by the side faces of adjacent child substrates is 5° or less, and more preferably 1° or less, allowing the directions of the crystal faces of adjacent child substrates to be as identical as possible.

When the parent substrate has an indefinite surface shape, the child substrates may be processed to form linear side faces using laser cutting, polishing, or the like, and then placed in the same manner as the child substrates having a rectangular surface shape.

Step of Bonding Child Substrates

The method for producing a single-crystal diamond substrate with a large area by bonding the plurality of child substrates obtained according to the above-described method will be described below for a case where the child substrates have a substantially identical thickness, and a case where the child substrates do not have an identical thickness.

(1) Case where the Child Substrates have a Substantially Identical Thickness

When the plurality of child substrates obtained as above have a substantially identical thickness, they are placed with side faces of adjacent child substrates being in contact with each other on a flat support, and the faces separated from the parent substrate being exposed as top faces, i.e., with the separated faces facing up.

In this case, the thicknesses of all of the child substrates need not be completely the same. The expression "the child substrates have a substantially identical thickness", as used herein, means that the difference in thickness is within the range of about 20 μm or less.

The child substrates may be aligned using any desired method, as long as they can be placed with the directions of their crystal faces being identical. For example, in the case of three child substrates, the substrates may be aligned in parallel, or may be aligned such that one contacting corner of two substrates is in contact with one side face of the other substrate. In the case of four substrates, the substrates may be aligned in parallel, or may be aligned such that they contact one another at one corner. According to the method of the invention, the boundary surface is coated with a grown diamond layer evenly and smoothly, even at the portions of contacting corners among child substrates, thereby achieving a favorable surface condition.

A single-crystal diamond is subsequently grown by a vapor-phase synthesis method on the faces of the aligned substrates separated from the parent substrate. Consequently, the plurality of child substrates placed on the support are bonded with the grown single-crystal diamond.

In this method, a single-crystal diamond is grown on a plurality of child substrates having a substantially identical thickness placed on a flat support, so that the faces of the resulting bonded child substrates separated from the parent substrate are substantially flush with one another. Furthermore, because a plurality of child substrates separated from the identical parent substrate are used, all of these child substrates have a uniform off-angle, crystal plane direction, strain distribution, defect distribution, etc.

Therefore, a single-crystal diamond having a uniform off-angle, crystal plane direction, strain distribution, defect distribution, etc. can be easily grown by growing a single-crystal diamond on these separated faces by a vapor-phase synthesis method. A uniform single-crystal diamond is grown even on the boundary portions of the child substrates, coating these boundary portions completely. This results in the formation of a single-crystal diamond substrate having a large area and having a uniform off-angle, crystal plane direction, strain distribution, defect distribution, etc.

The growth method is not limited; known vapor-phase synthesis methods that are applicable include, for example, a microwave plasma CVD method, a hot filament method, a DC discharge method, etc.

A high-purity single-crystal diamond film can be grown by using, in particular, a microwave plasma CVD method. Specific production conditions are not limited; a single-crystal diamond may be grown according to known conditions. A gas mixture of methane and hydrogen is usable as a source gas. Specifically, the conditions for diamond growth may, for example, be as follows. In the gas mixture of hydrogen and methane used as a reaction gas, methane is preferably supplied in a proportion of about 0.01 to about 0.33 mol per mol of hydrogen supplied. The pressure inside the plasma CVD apparatus can be typically about 13.3 to about 40 kPa. Microwaves typically used are those having a frequency of 2.45 GHz, 915 MHz, or like frequencies that are industrially or scientifically sanctioned. The microwave power is not limited, and is typically about 0.5 to about 5 kW. Within these ranges, the conditions may be adjusted so that the temperature of the substrates (child substrates of single-crystal diamond) is about 900 to about 1,300° C., and preferably about 900 to about 1,100° C.

The thickness of the single-crystal diamond grown is not also limited, and may be such that adjacent child substrates can be bonded sufficiently. The thickness may, for example, be about 100 to about 1,000 μm.

(2) Case where the Child Substrates do not have an Identical Thickness

When the plurality of child substrates do not have an identical thickness, a single-crystal diamond substrate having a large area and having a uniform off-angle, crystal plane direction, strain distribution, defect distribution, etc. can be obtained by performing the first bonding step and second bonding step described below. The following method can also be employed for a plurality of child substrates having a substantially identical thickness.

First Bonding Step

Child substrates obtained by the above-described etching step are first aligned on a flat support such that side faces of adjacent child substrates are in contact with each other. At this time, the child substrates are placed such that the faces separated from the parent substrate are in contact with the support.

The child substrates may be aligned in the same manner as the substrates having a substantially identical thickness.

A single-crystal diamond is subsequently grown by a vapor-phase synthesis method on the plurality of child substrates aligned. Consequently, the plurality of child substrates placed on the support are bonded with the grown single-crystal diamond.

The vapor-phase synthesis method is not limited; known methods that are applicable include, for example, a microwave plasma CVD method, a hot filament method, a DC discharge method, etc., as in the case where the child substrates have a substantially identical thickness. A high-purity single-crystal diamond film can be grown by using, in particular, a microwave plasma CVD method. Specific production conditions are not limited; a single-crystal diamond can be grown according to the method described above.

The thickness of the single-crystal diamond grown is not also limited, and may be such that adjacent child substrates can be bonded sufficiently. The thickness may, for example, be about 100 to about 1,000 μm.

FIG. 2 is a schematic diagram showing child substrates bonded with a grown single-crystal diamond layer in the first bonding step. As shown in FIG. 2, the top faces of single-crystal diamonds, which have been placed with the separated faces formed in the etching step being in contact with the support surface, are typically coarse, as compared with the separated faces. When the thicknesses of the child substrates are not strictly identical, a gap is formed between adjacent child substrates. Therefore, if diamond is grown on these faces by a vapor-phase synthesis method, the resulting diamond layers will be non-uniform, and each boundary portion between adjacent child substrates will not be coated uniformly with the diamond.

Second Bonding Step

In the next step, the child substrates bonded with the diamond layers are inverted, so that the diamond faces grown in the first bonding step come into contact with the support surface. Consequently, the faces separated from the parent substrate are exposed as top faces.

A single-crystal diamond is subsequently grown on these faces by a vapor-phase synthesis method. The conditions for the vapor-phase synthesis method may be the same as those in the first bonding step.

FIG. 3 is a schematic diagram showing a single-crystal diamond layer grown in the second bonding step. In the first bonding step, single-crystal diamond has been grown on the child substrates placed with their faces separated from the parent substrate being in contact with the flat support. Therefore, the faces of the bonded child substrates where they are separated from the parent substrate are substantially flush with one another. Furthermore, because a plurality of child substrates separated from the identical parent substrate are used, these child substrates all have a uniform off-angle, crystal plane direction, strain distribution, defect distribution, etc. Thus, a single-crystal diamond having a uniform off-angle, crystal plane direction, strain distribution, defect distribution, etc. can be easily grown by growing a single-crystal diamond on these separated faces by a vapor-phase synthesis method in this step. A uniform single-crystal diamond is grown evenly on the boundary portions of the child substrates, so that these boundary portions are completely coated with the diamond. This results in the formation of a single-crystal diamond having a large area, as well as a uniform off-angle, crystal plane direction, strain distribution, defect distribution, etc.

Furthermore, an even larger single-crystal diamond can be easily formed by using, as child substrates, a plurality of large single-crystal diamond substrates obtained by bonding a plurality of child substrates according to any of the above-described methods, and by bonding these large substrates according to the same method as that employed in the case where the child substrates have a substantially identical thickness.

Furthermore, an even larger single-crystal diamond can be easily formed by using, as a parent substrate, a large single-crystal diamond substrate obtained by bonding a plurality of child substrates according to any of the above-described methods, and by repeating the ion-implantation step, the step of etching a non-diamond layer, and the bonding step described above.

Effects of the Invention

According to the method for producing a single-crystal diamond substrate having a large area of the invention, mechanical processing for making the thickness of each child substrate uniform is not necessary when a large single-crystal diamond is produced by bonding a plurality of single-crystal diamonds. Furthermore, because the child substrates constituting a mosaic diamond have a uniform off-angle, crystal plane direction, strain distribution, and defect distribution, uniform diamond layers can be obtained according to set conditions, without the need to vary the diamond growth conditions for each child substrate.

Thus, precise growth of single-crystal diamond on the child substrates can be easily accomplished by a vapor-phase synthesis method, allowing the above-mentioned properties of a single-crystal diamond substrate having a large area prepared by bonding the child substrate to be uniform.

Furthermore, according to the methods of the invention, a large single-crystal diamond having a uniform off-angle, crystal plane direction, strain distribution, defect distribution, etc. can be produced relatively easily. The large diamond substrate obtained has uniform properties, which facilitates the treatment or processing on the large substrate. Therefore, devices of uniform quality can be evenly prepared on the thus-prepared large substrate of single-crystal diamond. Furthermore, even if the parent substrate contains defects, the large single-crystal diamond obtained contains identical defects for each of the bonded single-crystal diamond substrates, allowing unwanted portions to be easily identified during the preparation of devices or the like. Furthermore, it is possible to easily grow additional single-crystal diamond on the thus-prepared large single-crystal diamond substrate, in order to impart to the substrates strength sufficient to withstand various processes during the preparation of devices.

Therefore, according to the methods of the invention, it is possible to easily prepare a large mosaic substrate of single-crystal diamond that is particularly suitable for realizing the practical use of single-crystal diamond as a semiconductor material.

Effects similar to those of the invention can also be attained when a plurality of child substrates are prepared by using, instead of the ion implantation method used in the invention, other methods whereby a plurality of child substrates whose above-mentioned properties are uniform can be prepared. Furthermore, by replacing single-crystal diamond with single crystals of other wide bandgap semiconductors, such as SiC, GaN, AlN, and ZnO, similar effects can also be attained for these wide bandgap semiconductor single crystals.

DESCRIPTION OF EMBODIMENTS

Figure 1:
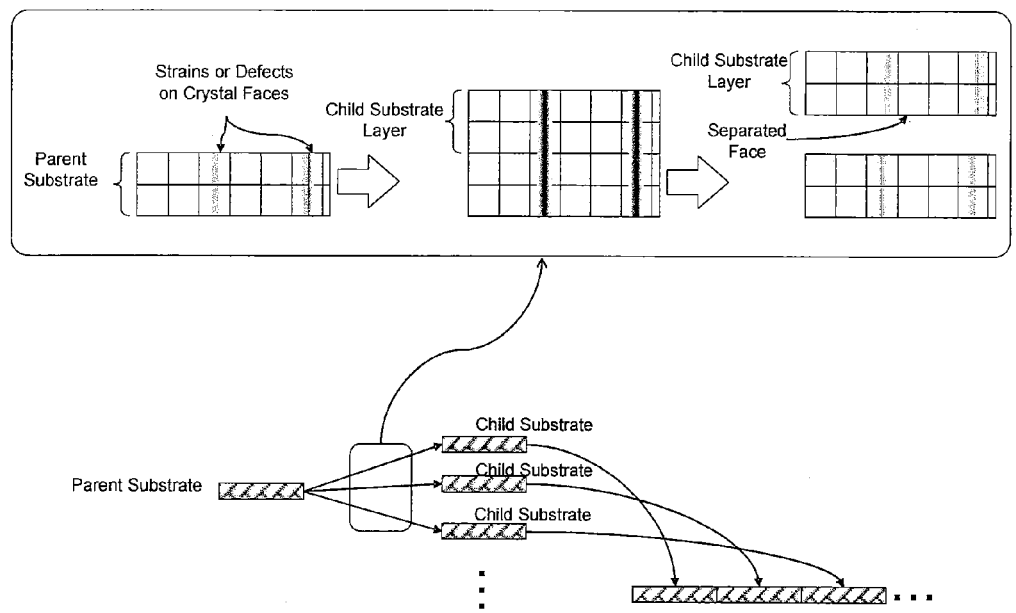
FIG. 1 shows schematic cross sections of the child substrates separated according to the method of the invention.
Figure 2:
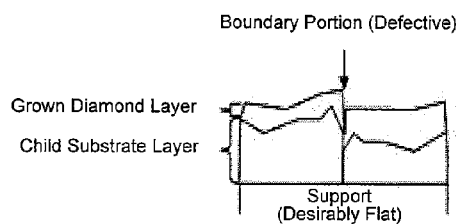
FIG. 2 is a schematic diagram showing child substrates bonded with a grown single-crystal diamond layer in the first bonding step.
Figure 3:
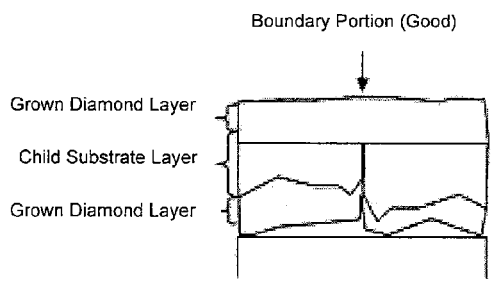
FIG. 3 is a schematic diagram showing a single-crystal diamond layer grown on the faces separated from the parent substrate in the second bonding step.

The invention is described in greater detail below, referring to the following Examples.

EXAMPLE 1

A single-crystal diamond (100) substrate having dimensions of 3×3×0.5 mm$^3$ was used as a parent substrate, and a large single-crystal diamond substrate was prepared according to the following method.

Carbon ions were first implanted into the single-crystal diamond substrate at an implantation energy of 3 MeV and a dose of 2×10$^{16}$ ions/cm$^2$, using a 1.5 MV tandem accelerator. The calculated value of the ion implantation depth was about 1.6 μm. After the radiation, the diamond substrate changed from transparent to black, which confirmed that a non-diamond layer was formed.

The single-crystal diamond substrate was subsequently heat-treated using a commercially available microwave plasma CVD apparatus, thereby causing the graphitization of the non-diamond layer to proceed. The conditions for heat treatment were as follows: a substrate temperature of 1,060° C.; a pressure of 16 kPa; a hydrogen gas flow rate of 500 sccm; and a treatment time of 5 minutes. Subsequent to the heat treatment, methane gas was passed at 25 sccm, and the growth of a single-crystal diamond film was conducted for 7 hours.

Two separate platinum electrodes were disposed at an interval of about 1 cm in a beaker containing pure water, and the single-crystal diamond substrate having the single-crystal diamond film grown by the above-described method was placed between the electrodes. An AC voltage with an effective value of 5.6 kV and a frequency of 60 Hz was applied across the electrodes, and the substrate was allowed to stand for 15 hours. As a result, the black, graphitized non-diamond layer was not visually observed. Because of the possibility that the non-diamond layer that could not be visually observed still remained, the application of an AC current was continued for another 24 hours under the same conditions. Consequently, the CVD-deposited single-crystal diamond film was removed from the single-crystal diamond substrate. The thickness of the CVD-deposited single-crystal diamond film was 65 μm, as measured using a micrometer.

The single-crystal diamond substrate from which the surface layer was removed by the above-described method was again subjected to the implantation of carbon ions and heat treatment, the growth of a single-crystal diamond film, and the removal of a surface layer by electrochemical etching, in the same manner as described above. The thickness of the CVD-deposited single-crystal diamond film was 103 μm, as measured using a micrometer.

The thus-obtained two single-crystal diamond substrates were subsequently aligned on a substrate support, with their separated faces facing down, so that the side faces of these substrates were placed in contact with each other in parallel when visually observed. Using a commercially available microwave plasma CVD apparatus, the growth of a single-crystal diamond film was subsequently conducted for 7 hours, at a substrate temperature of 1,000° C., a pressure of 16 kPa, a hydrogen gas flow rate of 500 sccm, and a methane gas flow rate of 25 sccm. As a result, the substrates were integrated.

Figure 4:
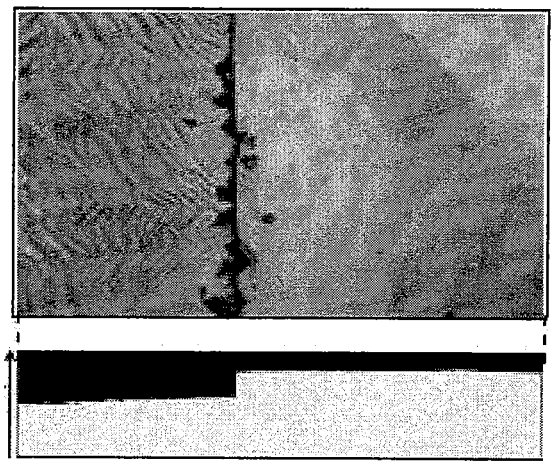
FIG. 4 shows a micrograph (upper section) of the surface of a bonded region after the first bonding step in Example 1; and an image (lower section) of a cross section around a bonded region, taken by a laser microscope.

FIG. 4 shows a micrograph (upper section) of the surface of a bonded region after diamond growth; and an image (lower section) of a cross section around a bonded region, taken by a laser microscope. As is clear from the image showing a cross section, there was a difference in thickness of about 50 μm between the substrates; thus, the surface was not uniformly coated with the grown diamond, resulting in a gap being formed between the substrates.

Figure 5:
FIG. 5 shows a micrograph (upper section) of the surface of a bonded region after the second bonding step in Example 1; and an image (lower section) of a cross section around a bonded region, taken by a laser microscope.

The integrated substrate was subsequently turned upside down, and a single-crystal diamond film was grown on the faces separated from the parent substrate under the same conditions as above. FIG. 5 shows a micrograph (upper image) of the surface of a bonded region after diamond growth; and an image (lower image) of a cross section around a bonded region, taken by a laser microscope. The boundary surface was confirmed to be coated with a diamond layer evenly and smoothly, thereby achieving a favorable surface condition.

EXAMPLE 2

A single-crystal diamond (100) substrate having a diameter of 9 mm and a thickness of 1 mm, and provided with a linear notch was used as a parent substrate, and a large single-crystal diamond substrate was prepared according to the following method.

The single-crystal diamond substrate was first implanted with ions by the same method as in Example 1. The single-crystal diamond substrate was subsequently heat-treated by the same method as in Example 1, using a commercially available microwave plasma CVD apparatus, thereby causing the graphitization of the non-diamond layer to proceed. The growth of a single-crystal diamond film was subsequently conducted for 3 hours, at a substrate temperature of 1,100° C., a pressure of 15 kPa, a hydrogen gas flow rate of 500 sccm, a methane gas flow rate of 25 sccm, and a nitrogen gas flow rate of 2 sccm.

The CVD-deposited single-crystal diamond film was then removed from the single-crystal diamond substrate according to the same method as in Example 1, by electrochemical etching. The thickness of the CVD-deposited single-crystal diamond film was 127 μm, as measured using a micrometer. The diamond film was subsequently laser cut, so as to form a linear side face in parallel with the notch.

The single-crystal diamond substrate from which the surface layer was removed by the above-described method was again subjected to the implantation of carbon ions and heat treatment, the growth of a single-crystal diamond film, and the removal of a surface layer by electrochemical etching, in the same manner as described above. The thickness of the CVD-deposited single-crystal diamond film was 139 μm, as measured using a micrometer. The diamond film was then laser cut, so as to form a linear side face in parallel with the notch.

The thus-obtained two single-crystal diamond substrates were subsequently aligned on a substrate support, with their separated faces facing down, so that the side faces of these substrates were placed in contact with each other in parallel when visually observed. Using a commercially available microwave plasma CVD apparatus, the growth of a single-crystal diamond film was subsequently conducted for 8 hours, at a substrate temperature of 930° C., a pressure of 15 kPa, a hydrogen gas flow rate of 500 sccm, and a methane gas flow rate of 25 sccm. As a result, the substrates were integrated. The integrated substrate was subsequently turned upside down, and the growth of a single-crystal diamond film on the faces separated from the parent substrate was conducted for 13 hours, under the same conditions as above. An observation of the surface condition of the bonded region after diamond growth using a laser microscope confirmed that the boundary surface was coated with the grown diamond evenly and smoothly, thereby achieving a favorable surface condition.

COMPARATIVE EXAMPLE 1

A single-crystal diamond (100) substrate having dimensions of 4.5×4.5×0.5 mm³ and an off-angle of 1.6°, and a single-crystal diamond (100) substrate having dimensions of 4.5×4.5×0.5 mm³ and an off-angle of 0.6° were each used as parent substrates, and two single-crystal diamond layers were prepared according to the following method. The former single-crystal diamond substrate is hereinafter referred to as "the parent substrate 1", and the latter is referred to as "the parent substrate 2". The difference in off-direction between these parent substrates was 54°.

Carbon ions were first implanted into the parent substrate 1 at an implantation energy of 3 MeV and a dose of 2×10¹⁶ ions/cm², using a 1.5 MV tandem accelerator. The calculated value of the ion implantation depth was about 1.6 μm. After the radiation, the parent substrate 1 changed from transparent to black, which confirmed that a non-diamond layer was formed.

The parent substrate 1 was subsequently heat-treated using a commercially available microwave plasma CVD apparatus, thereby causing the graphitization of the non-diamond layer to proceed. The conditions for heat treatment were as follows: a substrate temperature of 1,060° C.; a pressure of 15 kPa; a hydrogen gas flow rate of 890 sccm; and a treatment time of 3 minutes. Subsequent to the heat treatment, methane gas and nitrogen were passed at 66 sccm and 1.5 sccm, respectively, and the growth of a single-crystal diamond film was conducted for 6 hours.

Two separate platinum electrodes were disposed at an interval of about 1 cm in a beaker containing pure water, and the parent substrate 1 having the single-crystal diamond film grown by the above-described method was placed between the electrodes. An AC voltage with an effective value of 5.6 kV and a frequency of 60 Hz was applied across the electrodes, and the substrate was allowed to stand for 15 hours. As a result, the black, graphitized non-diamond layer was not visually observed. Because of the possibility that the non-diamond layer that could not be visually observed still remained, the application of an AC current was continued for another 24 hours under the same conditions. Consequently, the CVD-deposited single-crystal diamond film was removed from the parent substrate 1. The thickness of the CVD-deposited single-crystal diamond film was 235 μm, as measured using a micrometer.

Next, the parent substrate 2 was subjected to the implantation of carbon ions and heat treatment, the growth of a single-crystal diamond film, and the removal of a surface layer by electrochemical etching, in the same manner as described above. The thickness of the single-crystal diamond film removed from the parent substrate 2 was 246 µm, as measured using a micrometer.

The thus-obtained two single-crystal diamond substrates were subsequently aligned on a substrate support, with their separated faces facing down, so that the side faces of these substrates were placed in contact with each other in parallel when visually observed. Using a commercially available microwave plasma CVD apparatus, the growth of a single-crystal diamond film was subsequently conducted for 14 hours, at a substrate temperature of 1,000° C., a pressure of 15 kPa, a hydrogen gas flow rate of 500 sccm, and a methane gas flow rate of 25 sccm. As a result, the substrates were integrated.

The integrated substrate was subsequently turned upside down, and a single-crystal diamond film was grown on the faces separated from the parent substrate under the same conditions as above. Although the growth was conducted for 18 hours, the boundary surface was not smoothly coated.

TEST EXAMPLE 1

An experiment was conducted according to the following method, in order to confirm whether a diamond coating with a favorable surface condition can be formed even at overlapping corners of child substrates when three child substrates are bonded.

A single-crystal diamond layer was prepared using as a parent substrate a single-crystal diamond (100) substrate having dimensions of 4.5×4.5×0.5 mm$^3$, according to the following method.

The diamond substrate was first implanted with ions according to the same method as in Example 1. The single-crystal diamond substrate was subsequently heat-treated according to the same manner as in Example 1, using a commercially available microwave plasma CVD apparatus, thereby causing the graphitization of the non-diamond layer to proceed. The growth of a single-crystal diamond film was conducted for 6 hours, at a substrate temperature of 1,140° C., a pressure of 15 kPa, a hydrogen gas flow rate of 890 sccm, a methane gas flow rate of 66 sccm, and a nitrogen gas flow rate of 1.5 sccm.

The CVD-deposited single crystal diamond film was then removed from the single-crystal diamond substrate according to the same method as in Example 1, by electrochemical etching. The thickness of the CVD-deposited single-crystal diamond film was 221 µm, as measured using a micrometer.

The single-crystal diamond substrate from which the surface layer was removed by the above-described method was again subjected to the implantation of carbon ions and heat treatment, the growth of a single-crystal diamond film, and the removal of a surface layer by electrochemical etching, in the same manner as described above. The thickness of the CVD-deposited single-crystal diamond film was 216 µm, as measured using a micrometer. The CVD-deposited single-crystal diamond film was subsequently cut in parallel with one side of the outer periphery of the growth face.

Figure 6:
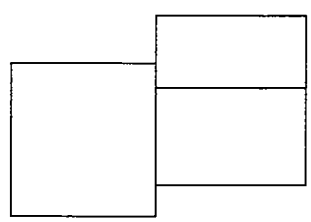
FIG. 6 is a schematic plan view of the arrangement of child substrates employed in Test Example 1 and Comparative Test Example 1.

The thus-obtained three single-crystal diamond substrates were subsequently aligned on a substrate support, with their separated faces facing down, so that the side faces of these substrates were placed in contact with each other in parallel when visually observed, as shown in FIG. 6. Using a commercially available microwave plasma CVD apparatus, the growth of a single-crystal diamond film was subsequently conducted for 13 hours, at a substrate temperature of 1,100° C., a pressure of 15 kPa, a hydrogen gas flow rate of 500 sccm, and a methane gas flow rate of 25 sccm. As a result, the substrates were integrated.

The integrated substrate was subsequently turned upside down, and a single-crystal diamond film was grown on the faces separated from the parent substrate under the same conditions as above. An observation of the surface conditions of bonded regions after diamond growth using a laser microscope confirmed that the boundary surface was coated evenly and smoothly with the grown diamond not only along the boundaries but also at the intersecting corners, thereby achieving a favorable surface condition.

COMPARATIVE TEST EXAMPLE 1

Single-crystal diamond layers were formed according to the following method on the surfaces of three commercially available single-crystal diamond (100) substrates having dimensions of 4.5×4.5×0.538±0.004 mm$^3$, and these diamond layers were integrated. The maximum difference in off-angle among the substrates was 1.4°, and the minimum difference was 0.1° or less. The maximum difference in off-direction among the substrates was 75°, and the minimum difference was 25°.

The three single-crystal diamond substrates were first aligned on a substrate support so that the side surfaces of these substrates were placed in contact with each other in parallel when visually observed, as shown in FIG. 6. Using a commercially available microwave plasma CVD apparatus, the growth of a single-crystal diamond film was subsequently conducted for 24 hours, at a substrate temperature of 1,100° C., a pressure of 16 kPa, a hydrogen gas flow rate of 500 sccm, and a methane gas flow rate of 25 sccm. As a result, the substrates were integrated.

The integrated substrate was subsequently turned upside down, and a single-crystal diamond film was grown on the faces of the turned substrate under the same conditions as above. An observation of the surface conditions of bonded regions after diamond growth with a laser microscope revealed that the boundary surface was not smoothly coated along the boundaries and at the intersecting corners.

What is claimed is:

1. A method for producing a single-crystal diamond substrate having a large area, comprising the steps of:
   (1) implanting ions into a parent substrate of single-crystal diamond to form a graphitized, non-diamond layer near a surface of the parent substrate, and subsequently etching the non-diamond layer to separate therefrom a single-crystal diamond layer above the non-diamond layer;
   (2) repeatedly subjecting the parent substrate used in Step (1) to the operation of Step (1), to separate from the parent substrate one or more single-crystal diamond layers having a substantially identical thickness to that of the single-crystal diamond layer separated in Step (1), wherein all of the single-crystal diamond layer obtained in Step (1) and the single-crystal diamond layers obtained in Step (2) are child substrates, wherein the separated faces of all of the child substrates have an off-set angle, crystal plane direction, strain distribution and defect distribution identical to those of the parent substrate, wherein each of the separated faces has been formed in Step (1) when separating each of the child substrates from the parent substrate;
   (3) placing the plurality of the child substrates on a flat support such that side faces of adjacent child substrates are in contact with each other, directions of crystal faces of all of the child substrates are identical, and the separated faces of the child substrates are exposed as top faces; and (4) growing a single-crystal diamond by a vapor-phase synthesis method on the separated faces of the plurality of child substrates placed on the support in Step (3), thereby bonding the plurality of child substrates.

2. The method according to claim 1, wherein Step (1) further comprises, subsequent to forming a non-diamond layer, and prior to etching the non-diamond layer, growing a single-crystal diamond layer on the surface of the parent substrate by a vapor-phase synthesis method.

3. The method according to claim 1, wherein the single-crystal diamond substrate having a large area obtained by the method of claim 1 is used as the parent substrate.

4. The method according to claim 1, wherein the single-crystal diamond substrate obtained in Step (4) is used as another parent substrate.

5. A method for producing a single-crystal diamond substrate having a large area, comprising the steps of:

(1) implanting ions into a parent substrate of single-crystal diamond to form a graphitized, non-diamond layer near a surface of the parent substrate, and subsequently etching the non-diamond layer to separate therefrom a single-crystal diamond layer above the non-diamond layer;

(2) repeatedly subjecting the parent substrate used in Step (1) to the operation of Step (1), to further separate from the parent substrate one or more single-crystal diamond layers, wherein all of the single-crystal diamond layer obtained in Step (1) and the single-crystal diamond layers obtained in Step (2) are child substrates, wherein the separated faces of all of the child substrates have an off-set angle, crystal plane direction, strain distribution and defect distribution identical to those of the parent substrate, wherein each of the separated faces has been formed in Step (1) when separating each of the child substrates from the parent substrate;

(3) placing the plurality of the child substrates on a flat support such that side faces of adjacent child substrates are in contact with each other, directions of crystal faces of all of the child substrates are identical, and the separated faces of the child substrates are in contact with a surface of the support;

(4) growing a single-crystal diamond by a vapor-phase synthesis method on the plurality of the child substrates placed on the support in Step (3), thereby bonding the plurality of the child substrates; and (5) inverting the child substrates bonded in Step (4) on the support, and subsequently growing a single-crystal diamond on the child substrates by a vapor-phase synthesis method, thereby growing a single-crystal diamond on the separated faces of the child substrates.

6. The method according to claim 5, wherein Step (1) further comprises, subsequent to forming a non-diamond layer, and prior to etching the non-diamond layer, growing a single-crystal diamond layer on the surface of the parent substrate by a vapor-phase synthesis method.

7. The method according to claim 5, wherein the single-crystal diamond substrate obtained in Step (5) is used as another parent substrate.

8. The method according to claim 5, wherein the single-crystal diamond substrate having a large area obtained by the method of claim 5 is used as the parent substrate.

9. A method for producing a single-crystal diamond substrate having a large area, comprising the steps of:

preparing a plurality of large single-crystal diamond substrates having a substantially identical thickness according to the method of claim 1;

placing the large substrates on a flat support such that side faces of adjacent substrates are in contact with each other, directions of crystal faces are identical, and single-crystal diamond layers grown by a vapor-phase synthesis method in Step (4) of claim 1 are exposed as top faces; and growing a single-crystal diamond thereon by a vapor-phase synthesis method, thereby bonding the plurality of large substrates.

10. A method for producing a single-crystal diamond substrate having a large area, comprising the steps of:

preparing a plurality of large single-crystal diamond substrates having a substantially identical thickness according to the method of claim 2;

placing the large substrates on a flat support such that side faces of adjacent substrates are in contact with each other, directions of crystal faces are identical, and single-crystal diamond layers grown by a vapor-phase synthesis method in Step (4) are exposed as top faces; and growing a single-crystal diamond thereon by a vapor-phase synthesis method, thereby bonding the plurality of large substrates.

11. A method for producing a single-crystal diamond substrate having a large area, comprising the steps of:

preparing a plurality of large single-crystal diamond substrates having a substantially identical thickness according to the method of claim 5;

placing the large substrates on a flat support such that side faces of adjacent substrates are in contact with each other, directions of crystal faces are identical, and single-crystal diamond layers grown by a vapor-phase synthesis method in Step (5) of claim 5 are exposed as top faces; and growing a single-crystal diamond thereon by a vapor-phase synthesis method, thereby bonding the plurality of large substrates.

12. A method for producing a single-crystal diamond substrate having a large area, comprising the steps of:

preparing a plurality of large single-crystal diamond substrates having a substantially identical thickness according to the method of claim 6;

placing the large substrates on a flat support such that side faces of adjacent substrates are in contact with each other, directions of crystal faces are identical, and single-crystal diamond layers grown by a vapor-phase synthesis method in Step (5) are exposed as top faces; and growing a single-crystal diamond thereon by a vapor-phase synthesis method, thereby bonding the plurality of large substrates.

* * * * *